(12) United States Patent
Pham et al.

(10) Patent No.: US 11,705,869 B2
(45) Date of Patent: Jul. 18, 2023

(54) LOW-LOAD-MODULATION POWER AMPLIFIER

(71) Applicant: MACOM Technology Solutions Holdings, Inc., Lowell, MA (US)

(72) Inventors: Bi Ngoc Pham, Attleboro, MA (US); Gerard Bouisse, Toulouse (FR)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/593,072

(22) Filed: Oct. 4, 2019

(65) Prior Publication Data
US 2020/0112287 A1 Apr. 9, 2020

(30) Foreign Application Priority Data

Oct. 5, 2018 (FR) ...................... 18/59231

(51) Int. Cl.
*H03F 1/02* (2006.01)
*H02M 7/48* (2007.01)
(Continued)

(52) U.S. Cl.
CPC ............ *H03F 1/0288* (2013.01); *H02M 7/48* (2013.01); *H03F 1/0277* (2013.01); *H03F 3/19* (2013.01); *H03F 3/21* (2013.01)

(58) Field of Classification Search
CPC ........ H03F 1/0288; H03F 1/0277; H03F 3/19; H03F 3/21; H03F 1/56; H03F 2200/408;
(Continued)

(56) References Cited

U.S. PATENT DOCUMENTS

| 4,375,054 A | 2/1983 | Pavio |
| 6,085,074 A | 7/2000 | Cygan |

(Continued)

FOREIGN PATENT DOCUMENTS

| CN | 101494439 A | 7/2009 |
| CN | 102137518 A | 7/2011 |

(Continued)

OTHER PUBLICATIONS

U.S. Appl. No. 16/639,105, filed Feb. 13, 2020, Pham et al.
(Continued)

*Primary Examiner* — Hafizur Rahman
*Assistant Examiner* — Khiem D Nguyen
(74) *Attorney, Agent, or Firm* — Perilla Knox & Hildebrandt LLP; Jason M. Perilla

(57) ABSTRACT

Apparatus and methods for a low-load-modulation power amplifier are described. Low-load-modulation power amplifiers can include multiple amplifiers connected in parallel to amplify a signal that has been divided into parallel circuit branches. One of the amplifiers can operate as a main amplifier in a first amplification class and the remaining amplifiers can operate as peaking amplifiers in a second amplification class. The main amplifier can see low modulation of its load between the power amplifier's fully-on and fully backed-off states. Improvements in bandwidth and drain efficiency over conventional Doherty amplifiers are obtained.

31 Claims, 6 Drawing Sheets

(51) Int. Cl.
*H03F 3/19* (2006.01)
*H03F 3/21* (2006.01)

(58) Field of Classification Search
CPC .... H03F 3/195; H03F 3/602; H03F 2200/451; H03F 2200/36; H03F 1/42; H02M 7/48
USPC ...................................... 330/277, 124 R, 295
See application file for complete search history.

(56) References Cited

U.S. PATENT DOCUMENTS

| | | |
|---|---|---|
| 6,262,629 B1 | 7/2001 | Stengel et al. |
| 6,649,287 B2 | 11/2003 | Weeks et al. |
| 6,791,417 B2 | 9/2004 | Pengelly et al. |
| 7,078,976 B2 | 7/2006 | Blednov |
| 7,109,790 B2 | 9/2006 | Kwon et al. |
| 7,218,175 B1 | 3/2007 | Kobayashi |
| 7,414,478 B2 | 8/2008 | Elmala et al. |
| 7,541,866 B2 | 6/2009 | Bowles et al. |
| 7,602,241 B2 | 10/2009 | Suzuki et al. |
| 7,663,434 B2 | 2/2010 | Yang et al. |
| 7,876,159 B2 | 1/2011 | Wang et al. |
| 7,973,600 B2 | 7/2011 | Yu |
| 8,237,498 B2 | 8/2012 | Kato et al. |
| 8,358,174 B2 | 1/2013 | Kim et al. |
| 8,395,450 B2 | 3/2013 | Deguchi et al. |
| 8,466,746 B2* | 6/2013 | Jeong ................... H03F 1/0266 330/295 |
| 8,487,703 B2 | 7/2013 | Blednov |
| 9,071,211 B1 | 6/2015 | Ozard |
| 9,083,284 B2 | 7/2015 | Maslennikov et al. |
| 9,331,638 B2 | 5/2016 | Chen et al. |
| 9,531,329 B2 | 12/2016 | Tanimoto |
| 9,543,914 B2 | 1/2017 | Bouny |
| 9,621,115 B1 | 4/2017 | Wu |
| 9,667,199 B1 | 5/2017 | McLaren |
| 9,673,766 B1 | 6/2017 | Roberts et al. |
| 9,774,301 B1 | 9/2017 | Maalouf et al. |
| 9,813,036 B2 | 11/2017 | Folkmann et al. |
| 9,966,903 B1 | 5/2018 | McLaren et al. |
| 10,211,785 B2 | 2/2019 | McLaren |
| 10,284,146 B2 | 5/2019 | Wu et al. |
| 10,284,147 B2 | 5/2019 | Wu et al. |
| 10,305,437 B2 | 5/2019 | Ozard et al. |
| 11,018,629 B2 | 5/2021 | Min et al. |
| 11,050,389 B2 | 6/2021 | Cassou et al. |
| 11,159,125 B2 | 10/2021 | Bouisse et al. |
| 11,190,143 B2 | 11/2021 | Pham et al. |
| 11,233,483 B2 | 1/2022 | Bouisse et al. |
| 11,245,363 B2 | 2/2022 | Bouisse |
| 11,283,410 B2 | 3/2022 | Bouisse |
| 11,496,098 B2 | 11/2022 | Wang |
| 11,515,842 B2 | 11/2022 | Wang et al. |
| 11,522,499 B2 | 12/2022 | Hue et al. |
| 2003/0137346 A1 | 7/2003 | Hellberg |
| 2003/0141933 A1 | 7/2003 | Pengelly |
| 2005/0206462 A1 | 9/2005 | McCorquodale et al. |
| 2006/0097783 A1 | 5/2006 | Okubo et al. |
| 2006/0145757 A1 | 7/2006 | Kim et al. |
| 2007/0205827 A1 | 9/2007 | Mobbs |
| 2010/0315162 A1 | 12/2010 | Gajadharsing et al. |
| 2011/0140775 A1 | 6/2011 | Hong et al. |
| 2011/0193624 A1 | 8/2011 | Scott et al. |
| 2011/0204980 A1 | 8/2011 | Blednov |
| 2012/0025915 A1 | 2/2012 | Ui |
| 2012/0092074 A1 | 4/2012 | Yanduru et al. |
| 2012/0105147 A1 | 5/2012 | Harris et al. |
| 2012/0319780 A1 | 12/2012 | Wilson et al. |
| 2013/0093534 A1 | 4/2013 | Mei |
| 2013/0154729 A1 | 6/2013 | Folkmann et al. |
| 2014/0118070 A1 | 5/2014 | Wilson et al. |
| 2014/0132343 A1 | 5/2014 | Colantonio et al. |
| 2014/0146917 A1 | 5/2014 | Muhammad |
| 2014/0218116 A1 | 8/2014 | Cui et al. |
| 2015/0002227 A1 | 1/2015 | Pribble et al. |
| 2015/0002230 A1 | 1/2015 | Qureshi |
| 2015/0091651 A1 | 4/2015 | Seneviratne et al. |
| 2015/0155838 A1* | 6/2015 | Embar ................... H03F 1/56 330/295 |
| 2015/0180428 A1 | 6/2015 | Pham et al. |
| 2016/0036398 A1 | 2/2016 | Li |
| 2016/0268976 A1 | 9/2016 | Negra et al. |
| 2016/0336903 A1 | 11/2016 | Ahmed et al. |
| 2017/0016322 A1 | 1/2017 | Hagenbuch |
| 2017/0019071 A1 | 1/2017 | Kobayashi et al. |
| 2017/0070193 A1 | 3/2017 | Juang et al. |
| 2017/0085228 A1 | 3/2017 | Abdo et al. |
| 2017/0163221 A1 | 6/2017 | Takagi et al. |
| 2018/0026583 A1 | 1/2018 | Yanduru et al. |
| 2018/0034418 A1 | 2/2018 | Blednov |
| 2018/0034419 A1 | 2/2018 | Moronval |
| 2018/0183388 A1 | 6/2018 | Pham |
| 2018/0191309 A1 | 7/2018 | McLaren |
| 2018/0233578 A1 | 8/2018 | Shi et al. |
| 2018/0254748 A1* | 9/2018 | Grebennikov ............ H03F 3/24 |
| 2019/0036487 A1 | 1/2019 | Jiang |
| 2019/0356277 A1 | 11/2019 | Bouisse et al. |
| 2020/0212847 A1 | 7/2020 | Pham et al. |
| 2021/0013572 A1 | 1/2021 | Zhu |

FOREIGN PATENT DOCUMENTS

| | | |
|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104704747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 A1 | 4/2012 |
| EP | 2458730 A1 | 5/2012 |
| EP | 2 698 918 A1 | 2/2014 |
| EP | 2 806 557 A1 | 11/2014 |
| EP | 2 876 810 A1 | 5/2015 |
| EP | 3 121 960 A1 | 1/2017 |
| EP | 3 133 735 A1 | 2/2017 |
| EP | 3 179 628 A2 | 6/2017 |
| EP | 3 179 638 A2 | 6/2017 |
| EP | 3054589 B1 | 7/2018 |
| JP | 2012222624 A | 11/2012 |
| TW | I336996 B | 2/2011 |
| TW | I377783 B | 11/2012 |
| TW | I462469 B | 11/2014 |
| TW | 201611514 A | 3/2016 |
| WO | WO 2009/027916 A2 | 3/2009 |
| WO | 2015176077 A2 | 11/2015 |
| WO | WO 2017/192075 A1 | 11/2017 |
| WO | 2018142176 A1 | 8/2018 |
| WO | 2018142177 A1 | 8/2018 |
| WO | 2018142178 A1 | 8/2018 |
| WO | 2018197917 A1 | 11/2018 |
| WO | 2018197918 A1 | 11/2018 |
| WO | 2018197919 A1 | 11/2018 |
| WO | 2019036499 A1 | 2/2019 |
| WO | 2019069115 A1 | 4/2019 |
| WO | 2020072898 A1 | 4/2020 |
| WO | 2021137951 A1 | 7/2021 |

OTHER PUBLICATIONS

U.S. Appl. No. 16/651,703, filed Mar. 27, 2020, Bouisse.
U.S. Appl. No. 16/530,293, filed Aug, 2, 2019, Bouisse et al.
International Preliminary Report on Patentability for International Application No. PCT/IB2018/046754 dated Feb. 27, 2020.
U.S. Appl. No. 16/607,079, filed Oct. 21, 2019, Bouisse.
U.S. Appl. No. 16/607,081, filed Oct. 21, 2019, Cassou.
U.S. Appl. No. 16/607,083, filed Oct. 21, 2019, Bouisse et al.

(56) References Cited

OTHER PUBLICATIONS

International Search Report and Written Opinion for Application No. PCT/IB2017/000727 dated Oct. 19, 2017.
International Preliminary Report on Patentability for International Application No. PCT/IB2017/000727, dated Aug. 15, 2019.
International Search Report and Written Opinion for Application No. PCT/IB2017/000608, dated Sep. 8, 2017.
International Preliminary Report on Patentability for International Application No. PCT/IB2017/000608, dated Nov. 7, 2019.
Invitation to Pay Additional Fees for Application No. PCT/IB2017/000717 mailed Oct. 6, 2017.
International Search Report and Written Opinion for Application No. PCT/IB2017/000717 dated Dec. 6, 2017.
International Preliminary Report on Patentability for International Application No. PCT/IB2017/000717, dated Aug. 15, 2019.
International Search Report and Written Opinion for Application No. PCT/IB2017/000722 dated Nov. 7, 2017.
International Preliminary Report on Patentability for International Application No. PCT/IB2017/000722, dated Aug. 15, 2019.
International Search Report and Written Opinion for Application No. PCT/US2017/068164 dated Mar. 13, 2018.
Written Opinion of the International Preliminary Examining Authority for Application No. PCT/US2017/068164 dated Dec. 5, 2018.
Ch. II International Preliminary Report on Patentability for International Application No. PCT/US2017/068164, dated Apr. 3, 2019.
International Search Report and Written Opinion for Application No. PCT/IB2018/046754 dated Nov. 22, 2018.
International Search Report and Written Opinion for Application No. PCT/IB2017/001575 dated Jun. 18, 2018.
International Search Report and Written Opinion for Application No. PCT/IB2017/000639 dated Sep. 8, 2017.
International Preliminary Report on Patentability for International Application No. PCT/IB2017/000639, dated Nov. 7, 2019.
International Search Report and Written Opinion for Application No. PCT/IB2017/000604 dated Sep. 8, 2017.
International Preliminary Report on Patentability for International Application No. PCT/IB2017/000604 dated Nov. 7, 2019.
International Search Report and Written Opinion for International Application No. PCT/US2019/054686, dated Dec. 19, 2019.
Camarchia et al., 7 GHz MMIC GaN Doherty Power Amplifier With 47% Efficiency at 7 dB Output Back-Off. IEEE Microwave and Wireless Components Letters. Jan. 2013;23(1):34-6.
Campbell, A Fully Integrated Ku-Band Doherty Amplifier MMIC. IEEE Microwave and Guided Wave Letters. Mar. 1999;9(3):114-6.
Cidronali et al., Frequency Analysis and Multiline Implementation of Compensated Impedance Inverter for Wideband Doherty High-Power Amplifier Design. IEEE Transactions on Microwave Theory and Techniques. May 2016;64(5):1359-72.
Grebennikov et al., High-Efficiency Doherty Power Amplifiers: Historical Aspect and Modern Trends. Proceedings of the IEEE. Dec. 2012;100(12):3190-219.
Kim et al., Doherty Linear Power Amplifiers for Mobile Handset Applications. Proceedings of Asia-Pacific Microwave Conference. Dec. 2006;1885-94.
Merrick et al., A wideband sequential power amplifier. 2014 IEEE MTT-S International Microwave Symposium (IMS2014), Jun. 1, 2014:1-3.
Moronval et al., A 100 W Multi-Band Four-Way Integrated Doherty Amplifier. IEEE MTT-S International Microwave Symposium (IMS) May 22, 2016:1-3.
Quaglia et al., K-Band GaAs MMIC Doherty Power Amplifier for Microwave Radio With Optimized Driver. IEEE Transactions on Microwave Theory and Techniques. Nov. 2014;62(11):2518-25.
Roberts, Understanding the 3 Level Doherty. 11th European Microwave Integrated Circuits Conference (EUMIC), European Microwave Association. Oct. 3, 2016:428-32.
Wicks et al., A 60-GHz Fully-Integrated Doherty Power Amplifier Based on 0.13-μm CMOS Process. Radio Frequency Integrated Circuits Symposium. Jun. 17, 2008;69-72.
Yu et al., Fully Integrated Doherty Power Amplifiers for 5 GHz Wireless-LANs. IEEE Radio Frequency Integrated Circuits Symposium (RFIC). Jun. 11, 2006;153-6.
Zhou et al., Design of an S-Band Two-Way Inverted Asymmetrical Doherty Power Amplifier for Long Term Evolution Applications. Progress in Electromagnetics Research Letters. 2013;39:73-80.
Andrei Grebennikov, "A high-efficiency 100-W four-stage Doherty GaN HEMT power amplifier module for WCDMA systems", 2011 IEEE MTT-S International Microwave Symposium.
Barthwal Ayushi et al, "A Design Strategy for Bandwidth Enhancement in Three-Stage Doherty Power Amplifier With Extended Dynamic Range", IEEE Transactions On Microwave Theory and Techniques, Plenum, USA, vol. 66, No. 2, ISSN 0018-9480, Feb. 2018.
Ceylan et al, "Refine Biasing Networks for High PA Low Frequency Stability," Microwave & RF, Apr. 17, 2018, pp. 1-6.
Daehyun Kang et al, "30.3% PAE HBT Doherty power amplifier for 2.5-2.7 GHz mobile WiMAX," Microwave Symposium Digest (MTT), 2010 IEEE MTT-S International, IEEE, Piscataway, NJ, USA, Piscataway, NJ, USA, (May 23, 2010), ISBN 978-1-4244-6056-4, pp. 796-799.
Daekyu Yu et al, "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.
Daniel Popp et al, "High Power and High Bandwidth Digital Three-Way Doherty Power Amplifier", 2019 IEEE 20th Wireless and Microwave Technology Conference (WAMICON), IEEE, (Apr. 8, 2019), doi:10.1109/WAMICON.2019.8765455, pp. 1-6, XP033577671.
International Search Report and Written Opinion in Application No. PCT/US2020/060158, dated Mar. 10, 2021.
Office Action for European Application No. 17825920.6 dated Dec. 1, 2021.
Office Action for Taiwanese Application No. 107113817 dated Oct. 6, 2021, with Translation.
Office Action from European Application No. 17726354.8 dated May 27, 2021.
Office Action from European Application No. 17728258.9 dated May 27, 2021.
Office Action from European Application No. 17732555.2 dated Aug. 11, 2021.
Office Action from European Application No. 17734137.7 dated Aug. 9, 2021.
Office Action in CN Application No. 201780092425.1, dated Jan. 10, 2023, With Summary.
Office Action in CN Patent Application No. 2017800924285, dated Dec. 23, 2022, with Translation.
Office Action in EP 17726356.3, dated May 20, 2021.
Office Action in EP 18759225.8, dated Oct. 27, 2021.
Office Action in TW Application No. 107103816, with Search Report, dated Feb. 25, 2021, with Translation.
Office Action in TW Application No. 107103822, with Search Report, dated Feb. 24, 2021, with Translation.
Office Action in TW Patent Application No. 107113817 dated Jan. 21, 2021, with Translation.
Search Report for Taiwanese Application No. 107113802 dated May 26, 2021.
Translation of Office Action in TW Patent Application No. 107103832, with Search Report dated Feb. 25, 2021.
Vigneau et al, "Fully integrated three-way LDMOS Doherty PAs for 1.8-2.2 GHz dual-band and 2.6 GHz m-MIMO 5G applications," Published in International Journal of Microwave and Wireless Technologies, Mar. 1, 2021.
Xia Jing et al, "Improved Three-Stage Doherty Amplifier Design With Impedance Compensation in Load Combiner for Broadband Applications", IEEE Transactions On Microwave Theory and Techniques, Plenum, USA, vol. 67, No. 2, doi: 10.1109/TMTT.2018.2884404, ISSN 0018-9480, (Feb. 1, 2019), pp. 778-786.

(56) References Cited

OTHER PUBLICATIONS

Cheng et al, "GaN HEMT Based Doherty Broadband Power Amplifier," Journal of Hangzhou Dianzi University (Natural Sciences), Mar. 15, 2017.

* cited by examiner

LOW-LOAD-MODULATION POWER AMPLIFIER

CROSS-REFERENCE TO RELATED APPLICATION

This application claims priority to French patent application number 18/59231, filed on Oct. 5, 2018. The entire contents of this application is incorporated herein by reference in its entirety.

BACKGROUND

Technical Field

The technology relates to high-speed, efficient, high-power amplifiers which can be constructed from multiple transistors operating in parallel circuit paths and formed from semiconductor materials such as, but not limited to, gallium nitride materials.

Discussion of the Related Art

High-speed power amplifiers formed from semiconductor materials have a variety of useful applications, such as radio-frequency (RF) communications, radar, RF energy, power conversion, and microwave applications. Gallium nitride semiconductor material has received appreciable attention in recent years because of its desirable electronic and electro-optical properties. Because of its wide bandgap, GaN is more resistant to avalanche breakdown and can maintain electrical performance at higher temperatures than other semiconductors, such as silicon. GaN also has a higher carrier saturation velocity and can sustain higher power densities compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications.

Applications supporting mobile communications and wireless internet access under current and proposed communication standards, such as WiMax, 4G, and 5G, can place austere performance demands on high-speed amplifiers constructed from semiconductor transistors. The amplifiers may need to meet performance specifications related to output power, signal linearity, signal gain, bandwidth, and efficiency.

SUMMARY

Apparatus and methods for amplifying radio-frequency signals are described. A multiclass power amplifier can include a plurality of amplifiers operating in parallel in different amplification classes and providing amplified signals to a common output. A main amplifier can amplify signals at low signal levels and high signal levels. Secondary amplifiers can be idle (non-amplifying) at low signal levels and become active (amplifying) as signal levels increase. The main amplifier can see a low modulation (compared to a conventional Doherty amplifier) of impedance at its output when the secondary amplifiers change between idle and fully-amplifying states.

Some embodiments relate to a low-load-modulation power amplifier comprising a main amplifier having a main output coupled to a first node, a first peaking amplifier having a first output coupled to the first node, a first impedance inverter connected between the first node and a second node, and a second peaking amplifier having a second output coupled to the second node, wherein the main amplifier, first peaking amplifier, and second peaking amplifier are in three parallel circuit branches.

Some embodiments relate to a method of operating a low-load-modulation power amplifier comprising acts of amplifying, with a main amplifier, a first portion of a received signal; receiving, at a first node, a first signal from the main amplifier; amplifying, with a first peaking amplifier arranged in parallel with the main amplifier, a second portion of the received signal; receiving, at the first node, a second signal from the first peaking amplifier; providing a first combined signal from the first node to a first impedance inverter; providing an output signal from the first impedance inverter to a second node; amplifying, with a second peaking amplifier arranged in parallel with the first peaking amplifier, a third portion of the received signal; and receiving, at the second node, a third signal from the second peaking amplifier.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device can be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Figure 1:
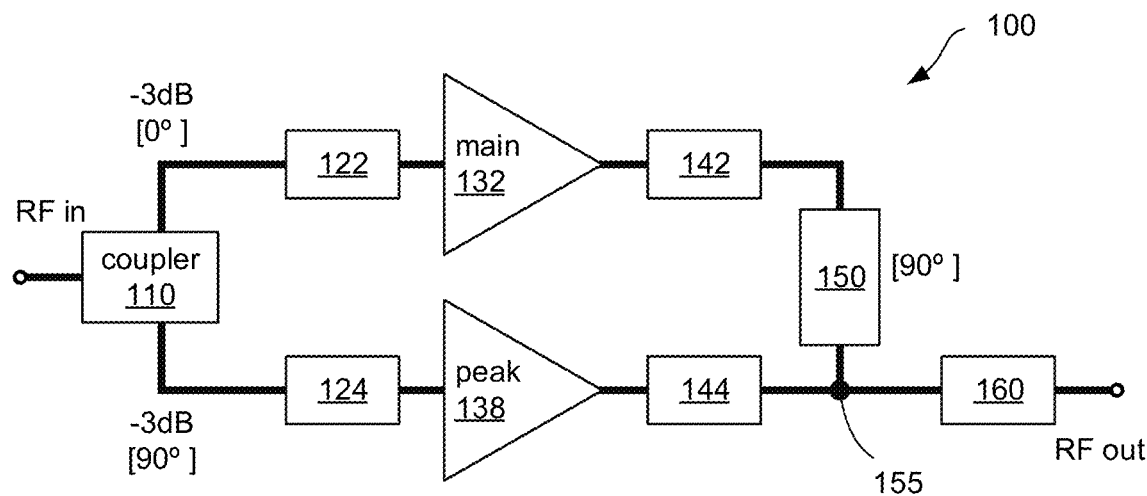
FIG. 1 depicts an arrangement of a Doherty amplifier.

One approach to amplifying signals to high power levels for wireless communications, for example, is to use a Doherty amplifier, an example of which is depicted schematically in FIG. 1. To aid in understanding the present technology, a brief summary of Doherty amplification is provided.

A Doherty amplifier 100 can include a main power amplifier 132 and a peaking power amplifier 138 that operate in parallel on a signal divided into parallel circuit branches. The peaking amplifier 138 is typically idle (not amplifying) at low signal levels, and turns on when the main amplifier 132 begins to saturate. Outputs from the two amplifiers are subsequently combined into a single RF output.

In further detail, a 90-degree power coupler 110 divides a received RF signal into two outputs that connect to the main amplifier 132 and the peaking amplifier 138. The power coupler 110 also delays (by approximately 90 degrees) the phase of the signal provided to the peaking amplifier 138 with respect to the phase of the signal provided to the main amplifier 132. Impedance-matching components 122, 124 may be placed before the main amplifier 132 and peaking amplifier 138. These impedance-matching components can transform impedance so as to match the input impedances of the two amplifiers 132, 138 to the impedances of the transmission lines connected to the amplifier inputs or to output impedances from the 90-degree coupler 110. Such impedance matching can reduce undesirable effects of signal reflections from the amplifiers.

Additional impedance-matching components 142, 144 may be located at the outputs of the main amplifier 132 and peaking amplifier 138 to match impedances between the output of the main amplifier 132 to the input of an impedance inverter 150 (which may be 50 ohms by design) and between the output of the peaking amplifier 138 and an impedance at the combining node 155 (which may also be 50 ohms). The impedance inverter 150 rotates the phase of the signal received from the main amplifier 132 by approximately 90 degrees, so that the signals from the main amplifier and peaking amplifier will be essentially in phase at the combining node 155. An output impedance-matching element 160 may be used between the combining node 155 and the Doherty amplifier's RF output to match the output impedance of the Doherty amplifier 100 to an impedance of a load (not shown).

In a symmetric Doherty amplifier, the main amplifier 132 and peaking amplifier 138 may be closely similar or identical semiconductor devices. For example, they may be configured to handle a same amount of signal power and amplify a signal to a same power level when both amplifiers are fully on and amplifying at their upper limit. Because the input signal is split equally to the two amplifiers, the signals to the main amplifier 132 and peaking amplifier are typically reduced by 3 dB at each output port of the coupler 110 compared to the input RF signal due to the splitting. Signal values expressed in "dB" refer to relative power levels.

Figure 2A:
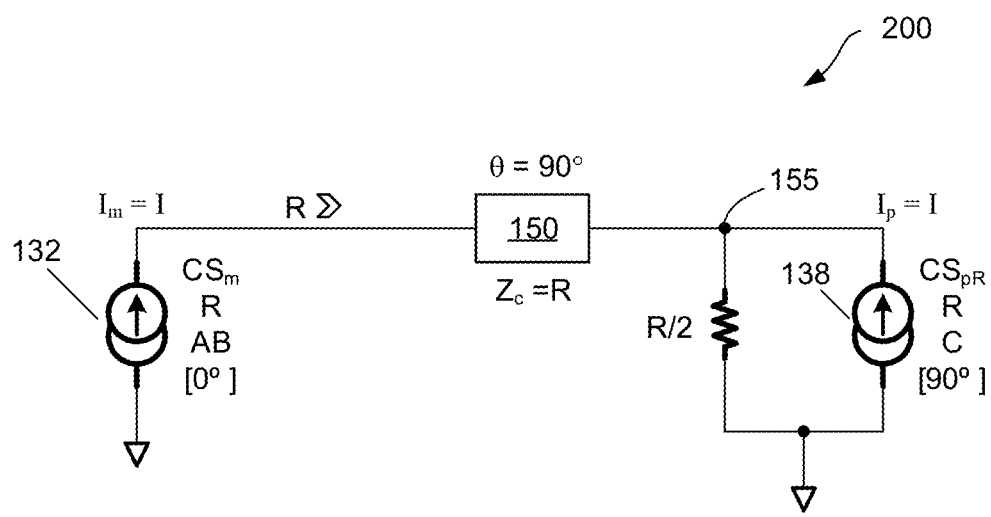
FIG. 2A depicts a circuit model for a symmetrical Doherty amplifier when a main amplifier and peaking amplifier are fully active.

Operational aspects of a Doherty amplifier are illustrated in further detail in FIG. 2A through FIG. 4. FIG. 2A is a simplified circuit model for a Doherty amplifier when both the main amplifier 132 and peaking amplifier 138 are fully active (amplifying their respective signals at full-power values). The main amplifier 132 operating in class AB mode and its output impedance-matching component 142 can be modeled as a current source $CS_m$ having an internal impedance R and providing no phase delay to the amplified signal. The peaking amplifier 138 operating in class C mode, its output impedance-matching component 144, and the phase delay of the coupler 110 can be modeled as a second current source $CS_p$ having an internal impedance R, but providing a 90-degree phase delay to amplified signals. The impedance inverter 150 can be modeled as a quarter-wavelength transmission line having a characteristic impedance of R and providing a phase delay of 90 degrees for a carrier wave of a signal, for example. According to some embodiments, a load driven by the Doherty amplifier may have an impedance of R/2.

The phase delays described herein are delays for a carrier wave of a radio-frequency signal that is modulated to encode information onto the carrier wave. For example, a carrier wave may oscillate at a frequency having a value in a range between 0.7 gigahertz (GHz) and 7 GHz, depending on what communication protocol is being used (e.g., 2G, 3G, 4G, etc.), and a phase delay is a delay in phase for a carrier wave for the relevant communication protocol. In some instances, the term "phase delay of a signal" or similar may be used and means phase delay of a carrier wave on which the signal is encoded.

The main amplifier 132 and peaking amplifier 138 may be designed for a particular carrier frequency and communication protocol. As one non-limiting example, an amplifier configured to handle signals for 4G communications may be designed for a carrier frequency of 2.6 GHz according to one protocol, and the specified phase delays of amplifier components are relative to 2.6 GHz. As another non-limiting example, an amplifier configured to handle signals for 4G communications may be designed for a carrier frequency of 1.9 GHz according to another protocol, and the specified phase delays of amplifier components are relative to 1.9 GHz.

When both the main amplifier 132 and peaking amplifier 138 are active and driving a load of R/2 with approximately equal amounts of current I, as depicted in FIG. 2A, straightforward calculations show that the main amplifier 132 sees an impedance R at its output, as indicated by the chevron symbol in FIG. 2A. This is referred to as a "1:1 load" condition for the Doherty amplifier. This impedance value can be calculated in a two-step process. First, the impedance seen looking into the combining node 155 from the impedance inverter 150 is calculated. Second, the impedance looking into the combining node is transformed according to the property of the quarter-wavelength impedance inverter 150 to find an impedance (in this case R) looking into the impedance inverter 150.

Figure 2B:
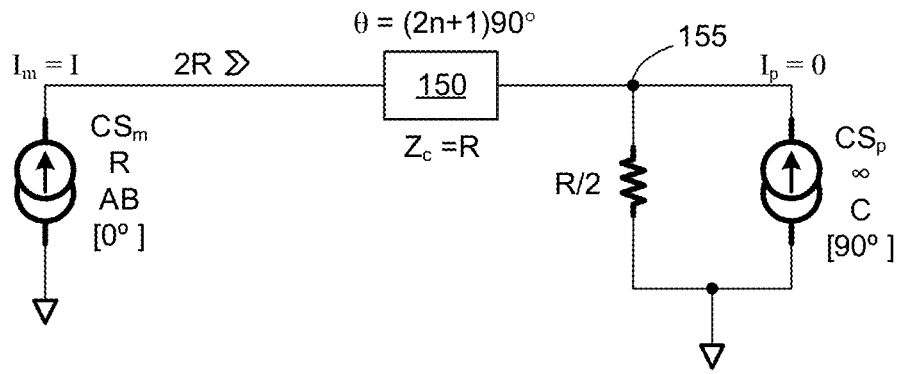
FIG. 2B depicts a circuit model for a symmetrical Doherty amplifier when a main amplifier is active and a peaking amplifier is idle (non-amplifying)

FIG. 2B depicts a circuit model for an operating condition of the Doherty amplifier when the peaking amplifier 138 is idle (non-amplifying). When an input RF signal to be amplified by the Doherty amplifier falls below a threshold value, the peaking amplifier 138 becomes idle (non-amplifying) and is modeled essentially as an open circuit. For this model, the impedance of the peaking amplifier changes from R to an infinite value in an idle state. Recalculating impedances looking into the combining node 155 and looking into the impedance inverter 150 from the main amplifier shows that the impedance value seen looking into the impedance inverter 150 rises to 2R. This operating condition is referred to as the "2:1 load" condition of the Doherty amplifier. In this case, the main amplifier's impedance R is no longer well matched to the impedance it is trying to drive. Such a mismatch can lead to signal reflections, high values of return loss, and inefficient operation of the Doherty amplifier.

The variation in impedance seen by the main amplifier 132 that depends on the state of the peaking amplifier 138 (which is determined by the input RF signal level) is referred to as "load modulation." Load modulation necessarily adversely affects power-handling capability of the amplifier and the amplifier's RF fractional bandwidth ($\Delta\omega/\omega_o$). For example, mismatches in impedance cause power reflections, and such reflections to the main amplifier may constrain the safe operating limit of the main amplifier appreciably below a power level that it could otherwise handle if there were no power reflections. The amount of reflected power may further depend on frequency, and changes in reflected power with frequency can take an amplifier out of compliance with a specification more quickly (resulting in a narrower bandwidth) than if there were no reflected power.

Figure 3:
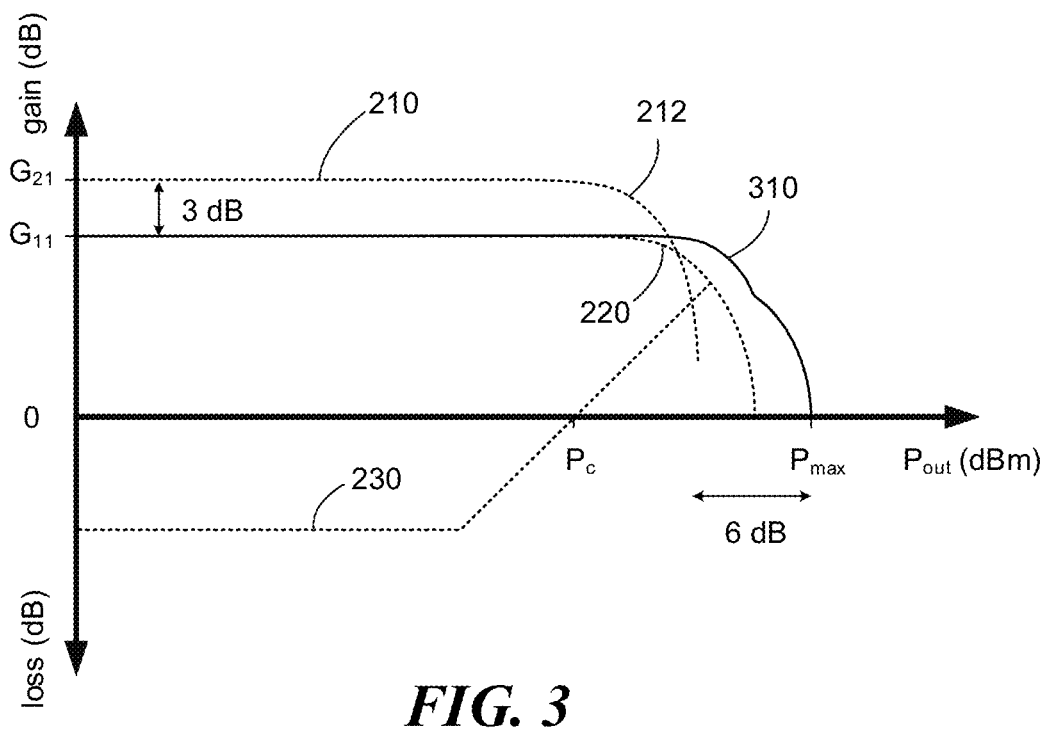
FIG. 3 illustrates gain as a function of output power for a Doherty amplifier.
Figure 4:
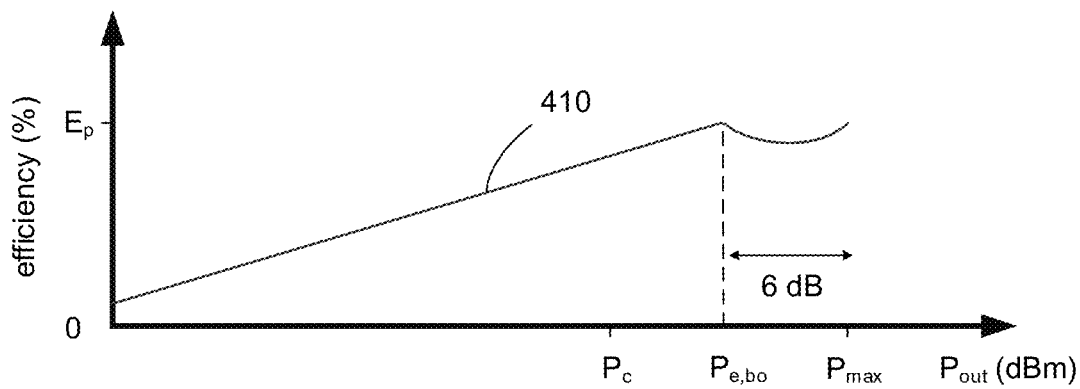
FIG. 4 illustrates efficiency of a Doherty amplifier as a function of output power.

Additional details of a Doherty amplifier's gain and efficiency dynamics are illustrated in FIG. 3 and FIG. 4. In FIG. 3, a first gain curve 210 (dotted line) depicts gain of a main amplifier 132 as a function of output power $P_{out}$ when the peaking amplifier 138 is idle (non-amplifying). The curve 210 corresponds to the so-called 2:1 load condition. The peaking amplifier is typically idle at low input signal power levels, e.g., input signal levels that will not begin saturating the main amplifier 132. These low input signal levels correspond to output power levels that are up to about 6 dB below a peak output power level of the Doherty amplifier. These low level signals can be handled by the main amplifier 132 only. At higher signal levels, the gain of the main amplifier 132 will begin to saturate and go into "compression," which begins at a power-compression point $P_c$ and is indicated by the fall-off region 212 in FIG. 3. At this point, the main amplifier 132 begins to amplify non-linearly, and would otherwise distort the input RF signal. The power-compression point for a main amplifier 132 will depend upon its design (e.g., the size of active areas in the amplifier's transistors), and could be any value from 1 Watt (30 dBm) to 100 Watts (50 dBm) for an amplifier used in a communication system. Smaller or larger values of the power-compression point may occur in some embodiments.

For a Doherty amplifier, the peaking amplifier 138 begins to amplify the input RF signal and contribute to the Doherty amplifier's output at the power-compression point $P_c$. An example gain curve 230 for the peaking amplifier 138 is also depicted in FIG. 3. The peaking amplifier 138 makes up for saturation of the main amplifier 132 at high powers until the peaking amplifier begins to saturate, go into compression, and fall off, as indicated in the drawing. Action of the peaking amplifier 138 can extend linear amplification by the Doherty amplifier over a range of high powers beyond the capability of the main amplifier 132 alone, until the peaking amplifier starts saturating.

FIG. 3 includes a second gain curve 220 for the main amplifier 132 when the peaking amplifier 138 is active (amplifying). The curve 220 corresponds to the 1:1 load condition. When the peaking amplifier 138 is active, it effectively adds load impedance to the main amplifier 132 (effectively reducing the gain of the main amplifier by about 3 dB) but also assists in amplifying high power levels (extending the Doherty's compression to higher powers). FIG. 3 also depicts a gain curve 310 (solid dark curve) as a function of output power for the Doherty amplifier. The Doherty gain curve 310 is a result of the combined actions of the main amplifier 132 and peaking amplifier 138 as described above.

An example drain efficiency curve 410 for a Doherty amplifier is illustrated in FIG. 4. The efficiency of the Doherty rises to a peak efficiency $E_p$ that occurs approximately when the gain of the peaking amplifier 138 has reached its highest value. Ideally in a Doherty amplifier, the peak efficiency $E_p$ would occur at about 6 dB below the maximum output power $P_{max}$, in a region referred to as "output power back-off" (OBO, though sometimes denoted OPO). The efficiency falls below the peak value $E_p$ for output power levels below the 6 dB OBO point in a region where the peaking amplifier is transitioning from low gain levels (where the peaking amplifier primarily loads the main amplifier) to its maximum gain (refer to FIG. 3).

In reality, the peak efficiency for a Doherty does not occur at 6 dB OBO, because of several effects present in conventional Doherty amplifiers. A first effect relates to isolation of the peaking amplifier 138 in power back-off. Although the peaking amplifier is modeled above as having infinite impedance (open circuit) in back-off, in practical applications the impedance is finite at 6 dB OBO. Further, the impedance inverter 150 and/or output matching elements 142, 144 can exhibit losses which may not be insignificant. Additionally, the main amplifier 132 and peaking amplifier 138 typically have non-ideal I-V curves and/or knee voltages. All these effects can cause the peak efficiency to occur at a value that is less than 6 dB OBO (e.g., about 5 dB OBO or less), which in turn causes the Doherty amplifier's efficiency to be reduced further than shown in FIG. 4 in a region of about 8 dB OBO to about 9 dB OBO.

The inventors have recognized and appreciated that load modulation in a Doherty amplifier can adversely affect power handling and bandwidth capability of a Doherty amplifier. The inventors have also recognized and appreciated that conventional Doherty amplifiers exhibit a peak efficiency in a region between about 5 dB OBO and about 6 dB OBO. The inventors have further recognized and appreciated that currently-developed signal protocols can increase the peak-to-average power ratio (PAPR) in communication signals to 7 dB or more to handle large data rates with high spectral efficiency. As a result, to preserve amplifier linearity a Doherty amplifier may be operated in a corresponding region (7 dB OBO or more) for a large portion of its operating time, which is a region where the conventional Doherty amplifier's efficiency is reducing.

Figure 5:
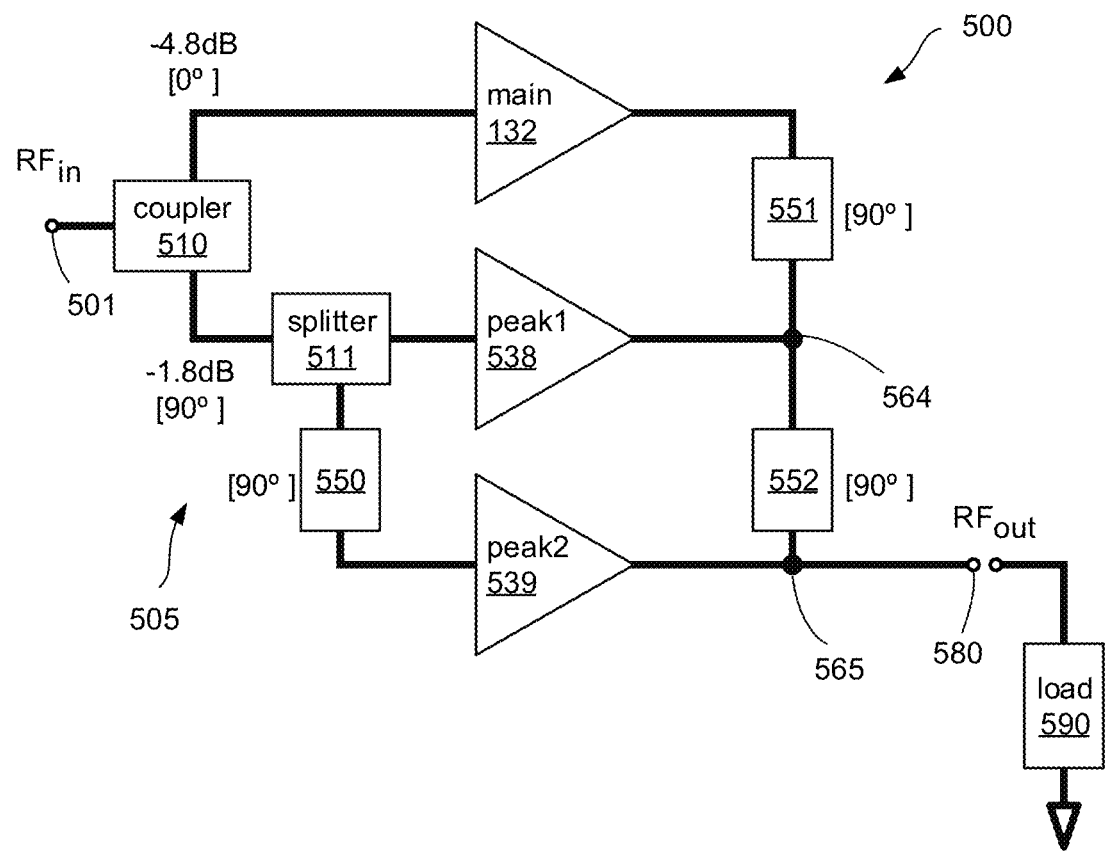
FIG. 5 depicts a schematic for an example high-efficiency, broadband, low-load-modulation power amplifier.

The inventors have conceived of a low-load-modulation, multiclass power amplifier that can exhibit a peak efficiency at back-off power margins of 6 dB or more and improved bandwidth capability over conventional Doherty amplifiers. The main amplifier in the low-load-modulation power amplifier can have appreciably less load modulation caused by transitions between fully-amplifying and idle or non-amplifying states of the peaking amplifiers than load modulation exhibited in a Doherty amplifier described above. An example of a low-load-modulation power amplifier 500 is depicted in FIG. 5.

According to some embodiments, a low-load-modulation power amplifier 500 can comprise a plurality of amplifiers (e.g., main amplifier 132, first peaking amplifier 538, and second peaking amplifier 539) operating in parallel on portions of a received signal (e.g., a received RF signal that is divided into parallel circuit branches). The received signal $RF_{in}$ at an input terminal 501 to the amplifier can be divided into the parallel circuit branches by signal dividing circuitry 505 and provided to the plurality of amplifiers. A low-load-modulation power amplifier 500 can further comprise a plurality of impedance inverters 550, 551, 552 (also known as quarter-wavelength transformers) coupled to the amplifiers. Amplified signals can be combined at a first combining node 564 and at a second combining node 565 as signals from the amplifiers are combined and provided to an output terminal 580. An impedance inverter 552 can be coupled between the first combining node 564 and the second combining node 565. In some implementations, output terminal 580 may be specified to connect to a load 590 having a specified impedance value (e.g., 50 ohms).

In some implementations, signal dividing circuitry 505 can comprise a power coupler 510 and a power splitter 511 connected to one output port of the power coupler, though the invention is not limited to only this combination of signal dividing components. The power coupler 510 can be configured to divide a received signal $RF_{in}$ into a first signal that is provided to the main amplifier 132 in a first circuit branch and a second signal that is provided to the splitter 511. The first signal may be one-third (⅓) the power of the received signal (to within 10%) and have a same phase (to within 10%) as the received signal, according to some embodiments. The second signal may be two-thirds (⅔) the power of the received signal (to within 10%) and have a phase that is 90-degrees (to within 10%) from the phase of the received signal, according to some embodiments.

Splitter 511 can, in some cases, divide power received at an input port into equal amounts (to within 10%) that are provided to a first peaking amplifier 538 in a second circuit branch and to a second peaking amplifier in a third circuit branch. Additionally, the signals output from splitter 511 may have equal phases (to within 10%). A first impedance inverter 550 can be connected between one output of splitter 511 and an input to the second peaking amplifier 539. The first impedance inverter 550 can rotate the phase of a received signal by 90 degrees (to within 10%), so that the phase of a signal received by the second peaking amplifier 539 differs from a phase of a signal received by the first peaking amplifier 538 by 90 degrees (to within 10%). The first impedance inverter 550 can also "invert" the impedance (e.g., rotate the impedance on a Smith chart by 180 degrees to within 10%) between its output and input terminals. In some implementations, each of the first, second, and third impedance inverters can delay the phase of a carrier wave by an amount between 85 degrees and 95 degrees.

In some cases, a coupler can be used in place of the splitter 511, wherein the coupler divides power equally to its two output ports and delays the phase of a signal's carrier wave provided to one output port by 90 degrees (to within 10%) with respect to the phase of a signal's carrier wave provided to its other output port. In such cases, the first impedance inverter 550 may comprise a device (e.g., lumped element network) that does not delay the phase of a signal.

In some cases, other power dividing ratios and phase relationships may exist after the first power-dividing element (coupler 510 in the illustrated example) and after the second power-dividing element (splitter 511 in the illustrated example). As described further below, other power ratios can be used to obtain different load-modulation values for the main amplifier 132. When other phase relationships are present after the power-dividing elements, phase-delay components can be connected in the parallel circuit branches. The phase-delay components can be configured such that the first peaking amplifier 538 receives a signal that is $((2N+1)90°)\pm10°$ different in phase from a signal received by the main amplifier 132, and the second peaking amplifier 539 receives a signal that is $((2N+1)90°)\pm10°$ different in phase from a signal received by the first peaking amplifier 538, wherein N is an integer ($|N|=0, 1, 2, \ldots$). In a preferred embodiment, the phase of a portion of the signal $RF_{in}$ received by the first peaking amplifier 538 is 90° different from a phase of a portion of the signal $RF_{in}$ received by the main amplifier 132, and a phase of a portion of the signal $RF_{in}$ received by the second peaking amplifier 539 is 90° different from a phase of a portion of the signal $RF_{in}$ received by the first peaking amplifier 538.

In embodiments, a second impedance inverter 551 is coupled between an output of the main amplifier 132 and a first combining node 564 and a third impedance inverter 552 is coupled between the first combining node 564 and a second combining node 565. There may be no impedance inverter connected between the first peaking amplifier 538 and first combining node 564. Additionally or alternatively, there may be no impedance inverter connected between the second peaking amplifier 539 and second combining node 565. The second impedance inverter 551 can include a phase delay that compensates for a phase delay (e.g., 90 degrees to within 10%) introduced between the input terminal 501 and the first peaking amplifier 538. The third impedance inverter 552 can include a phase delay that compensates for a phase delay (e.g., 90 degrees to within 10%) introduced between inputs to first peaking amplifier 538 and the second peaking amplifier 539. The second impedance inverter 551 and third impedance inverter 552 can each invert impedances between their output and input terminals. In some implementations, one or both of the second impedance inverter 551 and third impedance inverter can introduce no phase delay (e.g., be configured as an impedance-matching component that introduces no phase delay). In such implementations, there may be one or more phase-delay components coupled in series with either impedance-matching component to provide a respective compensating phase delay.

In some implementations, the second impedance inverter and/or third impedance inverter functionality can be incorporated in a corresponding impedance-matching component. For example the functionality of the second impedance inverter 551 can be incorporated in an impedance matching component located between the main amplifier 132 and the first combining node 564.

The circuit illustrated in FIG. 5 can additionally include one or more impedance-matching components located between the illustrated components of the circuit to transform an impedance from a downstream component's input impedance to an upstream component's output impedance, similar to the impedance-matching components 122, 124, 142, 144 depicted in FIG. 1. For example, there can be an impedance-matching component connected to the input of one or more of the main amplifier 132, first peaking amplifier 538, and second peaking amplifier 539. Additionally or alternatively, there can be an impedance-matching component connected to the output of one or more of the main amplifier 132, first peaking amplifier 538, and second peaking amplifier 539.

In operation, the main amplifier 132 of a low-load-modulation power amplifier 500 is configured to always operate in an active amplifying state when the low-load-modulation power amplifier 500 is powered on for operation. A received signal at an input terminal 501 can be divided equally or unequally into three portions that are provided to the main amplifier 132, first peaking amplifier 538, and second peaking amplifier 539. The main amplifier 132 can be biased to amplify its received portion according to a first amplification class (e.g., class A, class B, or class AB). The first peaking amplifier 538 and second peaking amplifier 539 can be biased to amplify their received portions of the input signal according to a second amplification class (e.g., class C). In embodiments, the first peaking amplifier 538 and second peaking amplifier 539 can be biased such that they are idle and non-amplifying when a received input signal is below a threshold value and enter an active, amplifying state when the received input signal exceeds the threshold value. The threshold value can be a signal level at which the main amplifier 132 begins to go into compression (e.g., a power-compression point $P_c$ as described in connection with FIG. 3). In some implementations, the power-compression point $P_c$ for the main amplifier of a low-load-modulation power amplifier 500 will depend upon the design of the main amplifier 132 (e.g., the size of active areas in the amplifier's transistors). The power-compression point could be any value from 1 Watt (30 dBm) to 100 Watts (50 dBm) for an amplifier used in a communication system. Smaller or larger values of the power-compression point can occur in a low-load-modulation power amplifier 500 used in other applications.

Above the power-compression point $P_c$ the first peaking amplifier 538 and/or second peaking amplifier 539 begin to amplify their received portions of the input signal $RF_{in}$ and their gain values and output powers increase until the peaking amplifiers go into compression. Each of the amplifiers are considered to be fully amplifying at a point immediately prior to the amplifier's power-compression point. According to some implementations, the first peaking amplifier 538 and second peaking amplifier 539 turn on simultaneously (e.g., at a same threshold value of the input signal $RF_{in}$) and reach their power-compression points simultaneously (e.g., at a same signal level of the input signal $RF_{in}$). In other embodiments, the first peaking amplifier 538 and second peaking amplifier 539 turn on in a staggered manner at different threshold values in the input signal, and reach their power-compression points at different signal levels of the input signal $RF_{in}$. The point at which the first peaking amplifier 538 and second peaking amplifier 539 begin to amplify their portions of the received signal can be set by biasing voltages applied to the amplifiers.

Figure 6:
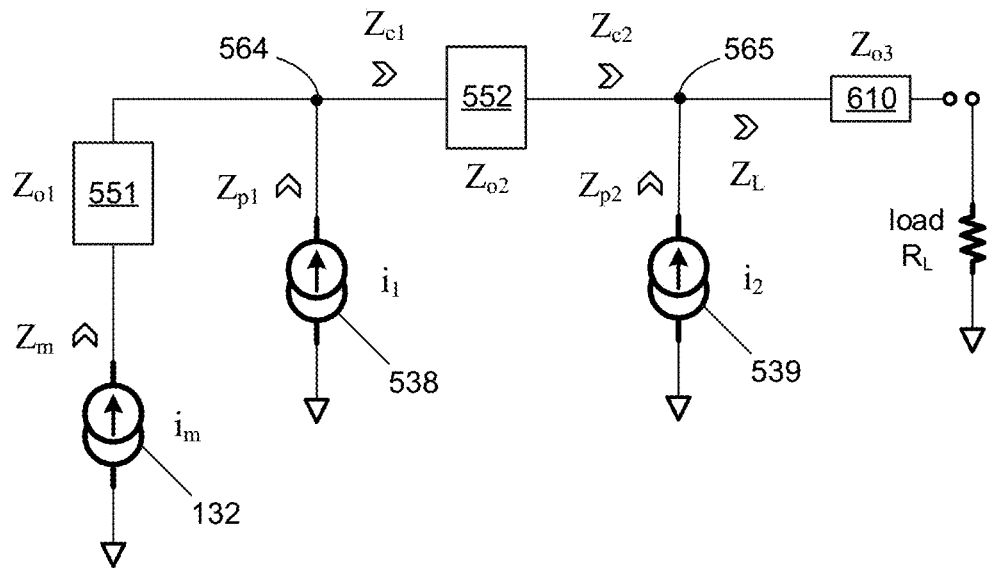
FIG. 6 depicts a circuit model for an example low-load-modulation power amplifier in a fully-amplifying state.

The impedance seen by the main amplifier during operation when all amplifiers are fully amplifying can be determined from the circuit model illustrated in FIG. 6. In the illustrated example, an impedance inverter 610 or impedance-matching network can been added between a load $R_L$ and second combining node 565. For example, an impedance inverter 610 having a characteristic impedance $Z_{o3}$ can be included to transform the impedance of a load $R_L$ to a value $Z_L$ that provides improved power delivery (e.g., less return loss and higher efficiency) from the low-load-modulation power amplifier 500. In some implementations, the impedance inverter 610 or an impedance-matching network can be included in a package with components of a low-load-modulation power amplifier 500. In other cases, the impedance inverter or an impedance-matching network can be external to a packaged low-load-modulation power amplifier 500.

In the illustrated embodiment, impedance inverter 610 has a characteristic impedance $Z_{o3}$, impedance inverter 551 has a characteristic impedance $Z_{o1}$, and impedance inverter 552 has a characteristic impedance $Z_{o2}$. For the illustrated embodiment, the main amplifier 132 is modeled as a first current source that delivers a current $i_m$ in its fully-amplifying state, the first peaking amplifier 538 is modeled as a second current source that delivers a current it in its fully-amplifying state, and the second peaking amplifier 539 is modeled as a third current source that delivers a current $i_2$ in its fully-amplifying state. Impedance values seen looking into nodes or impedance inverters are indicated by chevrons. For example, an impedance value seen by the main amplifier 132 looking into impedance inverter 551 is represented as $Z_m$.

By solving for voltage and current equations at the first combining node 564 and the second combining node 565, the impedance values seen at the output of each amplifier can be found. The impedance $Z_{m,full}$ seen at the output of the main amplifier 132 when all amplifiers are fully amplifying can be expressed as follows $$Z_{m,full} = \frac{Z_{o1}^2}{Z_{o2}^2} \frac{i_m(i_m + i_1 + i_2)}{(i_m + i_1)^2} Z_L \quad (1)$$

where $Z_{o1}$ is the characteristic impedance of the first impedance inverter 551 and $Z_{o2}$ is the characteristic impedance of the second impedance inverter 552.

When the low-load-modulation power amplifier 500 is fully backed off, the peaking amplifiers are not amplifying and the peaking amplifier circuit branches can be approximated as open circuits. In a fully backed-off state, the impedance $Z_{m,bo}$ seen at the output of the main amplifier 132 can be expressed as follows.

$$Z_{m,bo} = \frac{Z_{o1}^2}{Z_{o2}^2} Z_L \quad (2)$$

For reference, the impedance $Z_{p1}$ seen by the first peaking amplifier 538 in a fully-on state can be expressed as follows.

$$Z_{p1} = \frac{Z_{o2}^2}{Z_L} \frac{(i_m + i_1)^2}{i_m(i_m + i_1 + i_2)} \quad (3)$$

The impedance $Z_{p2}$ seen by the second peaking amplifier 539 in a fully-on state can be expressed as follows.

$$Z_{p2} = \frac{(i_m + i_1 + i_2)}{i_2} Z_L \quad (4)$$

In some implementations, the amount of maximum current (or maximum power) delivered by the first and second peaking amplifiers when fully amplifying can be essentially equal (e.g., $i_1 \approx i_2 \approx i_p$). However, the invention is not limited to having equal outputs from the two peaking amplifiers, and unequal outputs can be used. When the maximum current, or power, in the peaking amplifiers is essentially equal and the first impedance inverter 551 has essentially the same characteristic impedance as the second impedance inverter 552 ($Z_{o1} \approx Z_{o2}$) EQ. 1 and EQ. 2 can be rewritten as follows.

$$Z_{m,full} = \frac{i_m(i_m + 2i_p)}{(i_m + i_p)^2} Z_L \quad (5)$$

$$Z_{m,bo} = Z_L \quad (6)$$

A load modulation ratio $M_R$ for the main amplifier 132 can be defined as a ratio of the impedance seen by the main amplifier 132 when the peaking amplifiers 538, 539 are fully backed-off to an impedance seen by the main amplifier when the peaking amplifiers are fully amplifying ($Z_{m,bo}/Z_{m,full}$). From EQ. 5 and EQ. 6 and defining $r=i_p/i_m$, $M_R$ can be expressed as follows.

$$M_R = \frac{(1+r)^2}{(1+2r)} \quad (7)$$

As a first example embodiment, $i_p=i_m$. For such an embodiment, $M_R=1.3$. For comparison, the modulation ratio for the main amplifier in a conventional symmetric Doherty amplifier (for which the main and peaking amplifiers output essentially a same maximum amount of current or power) would be $M_R=2.0$. A lower modulation ratio for the low-load-modulation power amplifier 500 implies that the amplifier can reflect less power, operate at higher power levels, and have a larger bandwidth than a convention Doherty amplifier.

As a second example embodiment, $i_p=2i_m$. For such an embodiment, $M_R=1.8$. For comparison, the modulation ratio for the main amplifier in a conventional asymmetric Doherty amplifier (in which the peaking amplifier outputs twice as much maximum current as the main amplifier) would be $M_R=3.0$. For the low-load-modulation power amplifier 500 of the present embodiments, the modulation ratio $M_R$ can be kept significantly lower than the modulation ratio of a conventional Doherty amplifier as the amount of power handled by the peaking amplifiers is increased.

The relative location dP of the peak back-off efficiency point (indicated as $P_{e,bo}$ in FIG. 4) for a low-load-modulation power amplifier 500 expressed in dB from a peak output power from the amplifier 500 can be found from the following expression $$dP = 10\log \frac{1}{M_R i_t / i_m} \quad (8)$$

for which $i_t$ represents the total output current of the amplifier ($i_m + i_1 + i_2$) in a fully-amplifying state.

For a low-load-modulation power amplifier 500 in which $i_1=i_2=i_p=i_m$, the relative location of the peak back-off efficiency point is the same as for a conventional symmetric Doherty: dP=−6 dB. For a low-load-modulation power amplifier 500 of the above embodiment in which $i_p=2i_m$ the relative location of the peak back-off efficiency point increases to ~9.54 dB, a significant improvement compared to a conventional Doherty amplifier. A larger back-off amount for peak efficiency is desirable in communication systems that operate with higher peak-to-average power ratios. In some implementations, a relative location of the peak back-off efficiency for a low-load-modulation amplifier of the present embodiments is between −7 dB and −14 dB.

As can be appreciated from EQ. 7 and EQ. 8, the load-modulation ratio $M_R$ and the location of peak efficiency at back-off can be controlled by adjusting amounts of maximum current or power delivered by the main amplifier and peaking amplifier. According to some embodiments, the first peaking amplifier and the second peaking amplifier are configured to output a same amount of maximum power or current to within 10%. In some cases, the main amplifier is configured to output a same amount of maximum power or current as the first peaking amplifier to within 10%. In other cases, the main amplifier is configured to output an amount of maximum power or current that differs by at least 20% from an amount of maximum power or current output by the first peaking amplifier. According to some embodiments, the first peaking amplifier is configured to output a first amount of maximum power and the second peaking amplifier is configured to output a second amount of maximum power that is different from the first amount of maximum power by at least 20%.

In some embodiments, it can be beneficial to select values of characteristic impedances for the impedance inverters 551, 552 to have a particular ratio or to be proportional to a load $R_L$ that is driven by the low-load-modulation power amplifier 500. For example, in some embodiments $Z_{o1}=R_L$ (to within 10%) and $Z_{o2}=(R_L Z_L)^{1/2}$ (to within 10%). $Z_L$ can be an impedance seen after the second combining node 565 (e.g., a transformed impedance of the load $R_L$ as described herein). In embodiments, $R_L$ can have a real impedance value between 5 ohms and 100 ohms. In some embodiments, $R_L$ has a real value of impedance between 40 ohms and 60 ohms.

In one example embodiment in which $Z_{o1}=R_L$ (to within 10%) and $Z_{o2}=(R_L Z_L)^{1/2}$ (to within 10%), $R_L=50$ ohms and $Z_L$ can be 50/3 ohms. With these values, main amplifier 132 sees an impedance at its output of 50 ohms at back-off and 0.75×50 ohms when the peaking amplifiers are fully amplifying. Additionally, the first peaking amplifier 538 sees an impedance of 1.33×50 ohms when fully amplifying and the second peaking amplifier sees an impedance of 50 ohms when fully amplifying. The same impedances would be seen by the amplifiers if a load $R_L=50/3$ ohms, and there is no impedance inverter 610 located between the load and second combining node 565.

Figure 7:
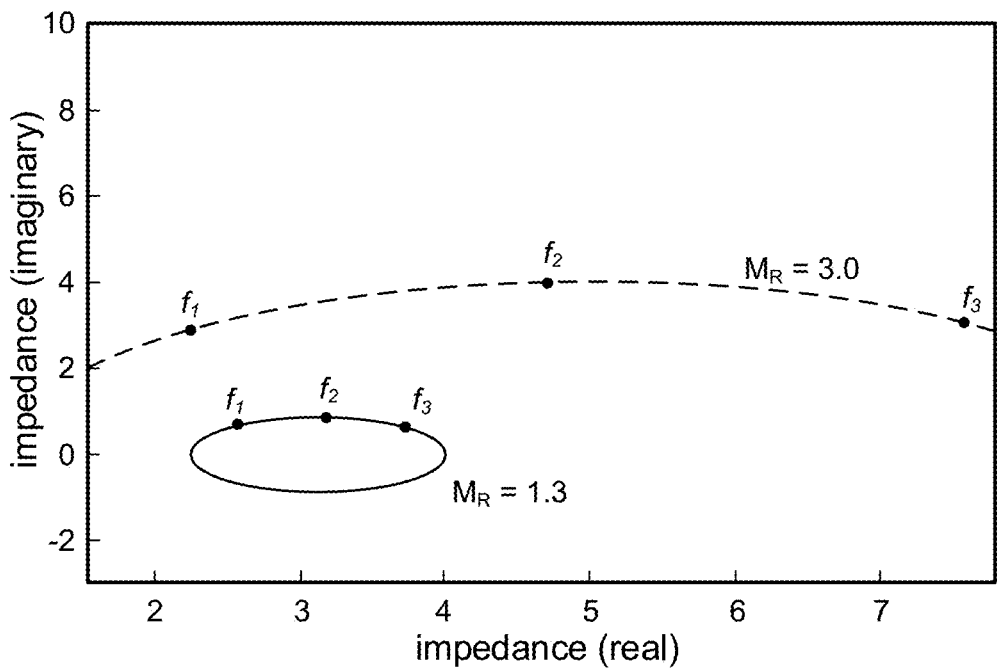
FIG. 7 illustrates impedance dispersion for an example low-load-modulation power amplifier at two values of modulation ratio.

FIG. 7 plots impedance dispersion contours as a function of frequency for a low-load-modulation power amplifier 500 and for a conventional Doherty power amplifier. For the low-load-modulation power amplifier 500, the power outputs from the main and peaking amplifiers are balanced when fully amplifying, corresponding to a modulation ratio $M_R=1.3$. In this case, the peaking amplifiers combined can output twice as much power as the main amplifier. An equivalent asymmetric power arrangement for a Doherty power amplifier in which the peaking amplifier outputs twice as much power as the main amplifier would produce a modulation ratio $M_R=3.0$, for which a contour is also shown in the plot. The frequencies indicated on the contours correspond to a mid-band frequency $f_2$, a low band-edge frequency $f_1$, and a high band-edge frequency $f_3$ that would be supported by a communication system, for example. As an example, $\Delta f=f_3-f_1$ can be representative of a video bandwidth of a communication system.

As the frequency of a signal amplified by a low-load-modulation power amplifier 500 having a modulation ratio $M_R=1.3$ varies from a mid-band frequency $f_2$, the value of impedance seen by the main amplifier changes and moves along the ellipse plotted as a dark contour in FIG. 7. At a high band-edge frequency $f_3$, the real impedance increases and the imaginary part of impedance decreases, as indicated on the ellipse. At a low band-edge frequency $f_1$, the real impedance decreases as does the imaginary part of the impedance. This change in impedance with frequency is referred to as impedance dispersion. In preferred embodiments, it would be desirable to have little or no impedance dispersion for different frequencies handled by an RF amplifier. Changes in impedance can affect reflected power and can constrain an operating bandwidth for the amplifier.

In comparison, the impedance dispersion for a Doherty amplifier with $M_R=3.0$ is significantly larger, as indicated by the contour plotted as a dashed line in FIG. 7. In the illustrated example, the impedance dispersion for a low-load-modulation power amplifier 500 is more than a factor of 3 less than impedance dispersion in a Doherty amplifier that can handle a comparable amount of power.

Figure 8:
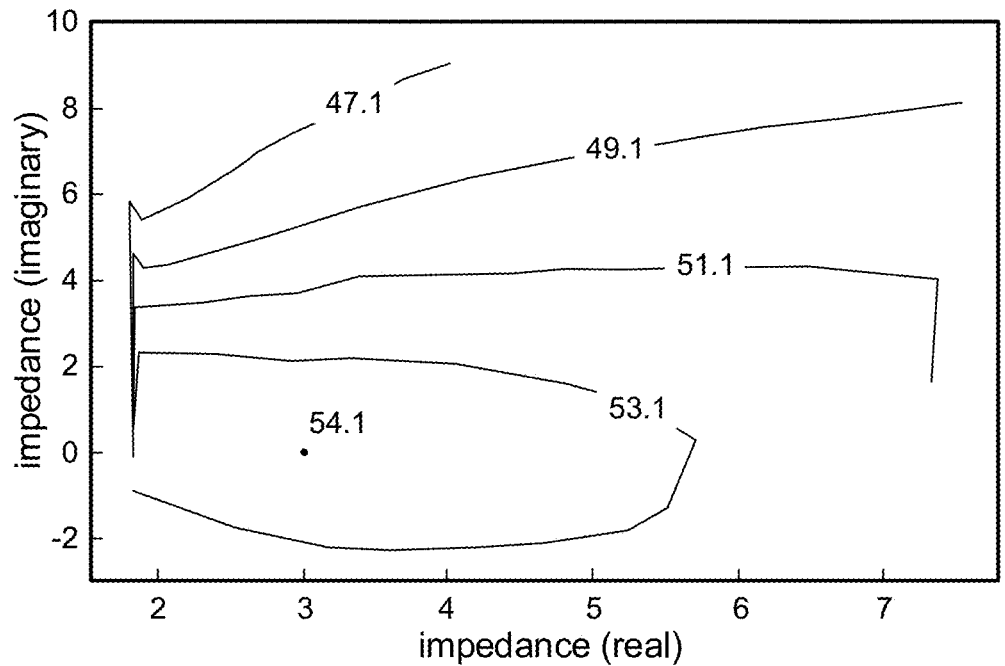
FIG. 8 plots power contours for an example low-load-modulation power amplifier, according to some embodiments.

FIG. 8 plots power contours for a low-load-modulation power amplifier 500. A contour represents an amount of power (in dBm) that a balanced low-load-modulation power amplifier 500 of the present embodiments would output for a load impedance $Z_L$ that lies on the contour. $Z_L$ can be presented to the power amplifier 500 by selecting an appropriate characteristic impedance for an impedance inverter 610 inserted between a load $R_L$ and the second combining node 565. In some embodiments, output powers of up to 54 dBm are possible with a low-load-modulation power amplifier 500.

Figure 9:
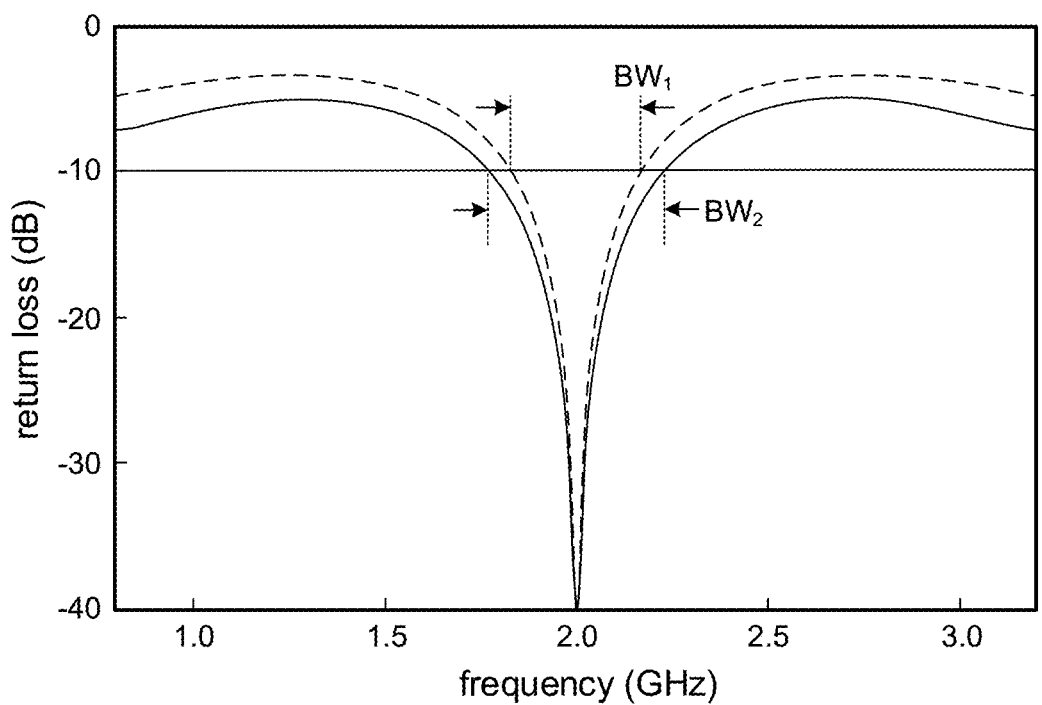
FIG. 9 plots return loss for an example low-load-modulation power amplifier (solid curve) and for a Doherty amplifier (dashed curve), according to some embodiments.

A comparison of amplifier fractional bandwidths is depicted in FIG. 9. Return loss values were computed from simulations in which the amplifiers were arranged to drive 50-ohm loads. Fractional bandwidth can be represented symbolically as $\Delta\omega/\omega_o$ and in this example represents a bandwidth between the −10 dB return loss points at an output of the amplifier relative to the carrier frequency $\omega_o$ applied to the device. For the illustrated example, the carrier frequency is 2 GHz. A fractional bandwidth for a symmetric Doherty amplifier can be determined from the dashed line, and is found to be essentially 16.9%. A fractional bandwidth for a balanced low-load-modulation power amplifier 500 can be determined from the solid line, and is found to be essentially 22.7%. The increase in bandwidth for the low-load-modulation power amplifier 500 represents a 34.3% improvement over the conventional Doherty amplifier.

Figure 10:
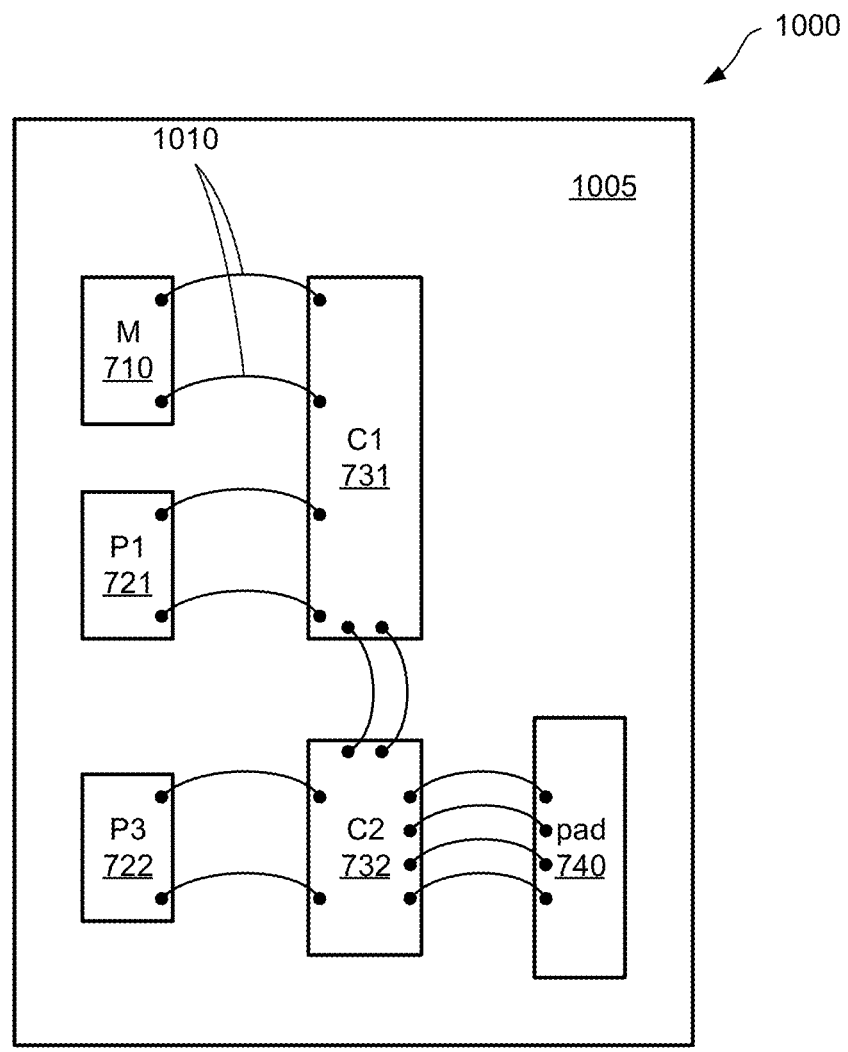
FIG. 10 illustrates structure that can be used to construct a high-efficiency, low-load-modulation power amplifier on a circuit board or monolithic microwave integrated circuit (MMIC), according to some embodiments.

A low-load-modulation power amplifier 1000 can be embodied as integrated circuit devices mounted on a circuit board or palate 1005, as depicted in FIG. 10 for example. In some embodiments, the main amplifier 710, first peaking amplifier 721, and second peaking amplifier 722 can be embodied as an integrated circuit comprising one or more transistors. In some cases, the transistors may be formed from gallium-nitride material as field-effect transistors, bipolar transistors, or high-electron-mobility transistors (HEMTs), though other types of transistors may be used in some embodiments. For example, a main amplifier 710 can be microfabricated on a wafer that is cut to provide at least one die that includes an array of GaN HEMT devices. Example GaN HEMT devices are described in U.S. patent application Ser. No. 15/223,614 titled "High-Voltage GaN High Electron Mobility Transistors," filed Jul. 29, 2016 and incorporated herein by reference in its entirety. The die can be attached to a circuit board or a microwave monolithic integrated circuit (MMIC) 1005 that also includes the peaking amplifiers 721, 722, the signal dividing circuitry 520, 522, and the impedance inverters 550, 551, 552. Each of the peaking amplifiers, like the main amplifier, can be fabricated on a semiconductor wafer that is cut to form individual die. Additional circuit elements (e.g., impedance-matching components, phase delay elements, microstrip transmission lines, etc.) can be included on the circuit board or MMIC.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Suitable gallium-nitride materials are described in U.S. Pat. No. 6,649,287, which is incorporated herein by reference in its entirety.

Connections between amplifier components in a packaged low-load-modulation power amplifier 1000 can be implemented with wire bonds 1010, as depicted in FIG. 10. A number and length of wire bonds connecting two components can be selected to control an amount of inductance contributed to a circuit by the wire bonds. Discrete capacitors 731, 732 (e.g., bar capacitors) can also be connected in a packaged low-load-modulation power amplifier 1000, and used with wire bonds 1010 to form lumped element networks that provide the functionality for impedance inverters 550, 551, 552 described above. In some cases, one electrode of a capacitor can connect to a reference potential such as ground. In some implementations, an electrode of a capacitor can serve as a combining node of a power amplifier. Wire bonds in a packaged low-load-modulation power amplifier 1000 circuit can also connect to one or more pads 740 which may connect to input or output terminals (not shown) for the packaged device. In some cases, wire bonds in a packaged low-load-modulation power amplifier 1000 circuit may connect directly to an input or output terminal without connecting to an intervening pad 740. For example, wire bonds may connect directly between a capacitor 732 and output terminal.

For embodiments like that shown in FIG. 10, drain-to-source capacitances ($C_{ds}$) of the individual amplifiers can be used as part of a lumped-element network that includes the bond wires 1010 and a discrete capacitor. The resulting network can form an impedance inverter (e.g., inverters 551, 552 referring to FIG. 5) that are located between the amplifiers' outputs and the combining nodes. For example, the drain-to-source capacitances of a main amplifier die 710, bond wires 1010, and portion of a capacitor 731 can form a first impedance inverter. In this manner, the power amplifier can be assembled as a compact package.

Power amplifiers of the present embodiments can be included in electronic devices associated with radio-frequency (RF) communications, radar, RF energy, power conversion, and microwave applications. For example, power amplifiers of the present embodiments can be included mobile phones, tablets, and laptop computers as well as power inverters, voltage converters, radar transmitters, and microwave generators.

Methods of operating a low-load-modulation power amplifier are also contemplated by the inventors. An example method can comprise acts of amplifying, with a main amplifier, a first portion of a received signal and receiving, at a first node, a first signal from the main amplifier. An example method can also include acts of amplifying, with a first peaking amplifier arranged in parallel with the main amplifier, a second portion of the received signal, and receiving, at the first node, a second signal from the first peaking amplifier. Further acts can include providing a first combined signal from the first node to a first impedance inverter; providing an output signal from the first impedance inverter to a second node; amplifying, with a second peaking amplifier arranged in parallel with the first peaking amplifier, a third portion of the received signal; and receiving, at the second node, a third signal from the second peaking amplifier.

Power amplifiers described herein can be embodied in various configurations. Example configurations include combinations of configurations (1) through (17) as described below.

(1) A power amplifier comprising a main amplifier having a main output coupled to a first node; a first peaking amplifier having a first output coupled to the first node; a first impedance inverter connected between the first node and a second node; and a second peaking amplifier having a second output coupled to the second node, wherein the main amplifier, first peaking amplifier, and second peaking amplifier are in three parallel circuit branches.

(2) The power amplifier of configuration 1, further comprising a second impedance inverter coupled to an input of the second peaking amplifier.

(3) The power amplifier of configuration 2, further comprising a third impedance inverter connected between the main output of the main amplifier and the first node.

(4) The power amplifier of configuration 3, wherein a characteristic impedance of the third impedance inverter is equivalent, to within 10%, of an impedance of a load that the power amplifier is configured to drive.

(5) The power amplifier of configuration 3, wherein the first impedance inverter, the second impedance inverter, and the third impedance inverter each delay the phase of a carrier wave by an amount between 85 degrees and 95 degrees.

(6) The power amplifier of any one of configurations 1 through 5, wherein the first impedance inverter has a characteristic impedance that is equivalent, to within 10%, of a product of an impedance of a load that the power amplifier is configured to drive and an impedance seen at the output of the second combining node.

(7) The power amplifier of any one of configurations 1 through 6, wherein the second node connects to an output terminal of the power amplifier.

(8) The power amplifier of configuration 7, wherein the output terminal is specified to connect to a load comprising a real impedance RL between 5 ohms and 100 ohms.

(9) The power amplifier of any one of configurations 1 through 8, wherein the main amplifier is configured to operate in a first amplifier class, and the first peaking amplifier and the second peaking amplifier are configured to operate in a second amplifier class that is different from the first amplifier class.

(10) The power amplifier of any one of configurations 1 through 9, wherein the first peaking amplifier and the second peaking amplifier are configured to enter a non-amplifying state when an input signal to the power amplifier drops below a threshold value, while the main amplifier continues to amplify a received input signal.

(11) The power amplifier of any one of configurations 1 through 10, further comprising signal dividing circuitry arranged to receive an input signal from an input terminal of the power amplifier and output portions of the input signal to the main amplifier, the first peaking amplifier and the second peaking amplifier.

(12) The power amplifier of configuration 11, wherein the signal dividing circuitry comprises: a coupler that divides a received signal from the input terminal into unequal portions; and a splitter that divides a received signal into equal portions connected to one output port of the coupler.

(13) The power amplifier of any one of configurations 1 through 12, wherein the first peaking amplifier and the second peaking amplifier are configured to output a same amount of maximum power or current to within 10%.

(14) The power amplifier of configuration 13, wherein the main amplifier is configured to output a same amount of maximum power or current as the first peaking amplifier to within 10%.

(15) The power amplifier of configuration 13, wherein the main amplifier is configured to output an amount of maximum power or current that differs by at least 20% from an amount of maximum power or current output by the first peaking amplifier.

(16) The power amplifier of configuration 15, wherein the main amplifier is configured to output an amount of maximum power or current that differs from an amount of maximum power or current output by the first peaking amplifier such that a relative location of the peak back-off efficiency for the power amplifier is between −7 dB and −14 dB.

(17) The power amplifier of any one of configurations 1 through 16, wherein the first peaking amplifier is configured to output a first amount of maximum power and the second peaking amplifier is configured to output a second amount of maximum power that is different from the first amount of maximum power by at least 20%.

Methods of operating power amplifiers of the foregoing configurations include different combinations of acts as described in methods (18) through (31) below.

(18) A method of operating a low-load-modulation power amplifier, the method comprising: amplifying, with a main amplifier, a first portion of a received signal; receiving, at a first node, a first signal from the main amplifier; amplifying, with a first peaking amplifier arranged in parallel with the main amplifier, a second portion of the received signal; receiving, at the first node, a second signal from the first peaking amplifier; providing a first combined signal from the first node to a first impedance inverter; providing an output signal from the first impedance inverter to a second node; amplifying, with a second peaking amplifier arranged in parallel with the first peaking amplifier, a third portion of the received signal; and receiving, at the second node, a third signal from the second peaking amplifier.

(19) The method of (18), wherein the third portion of the received signal passes through a second impedance inverter coupled to an input of the second peaking amplifier.

(20) The method of (18) or (19), further comprising providing the amplified first portion of the received signal to a third impedance inverter connected between an output of the main amplifier and the first node.

(21) The method of any one of (18) through (20), further comprising delaying, by the first impedance inverter, a phase of a carrier wave of the first combined signal by an amount between 85 degrees and 95 degrees.

(22) The method of any one of (18) through (21), further comprising providing a second combined signal from the second node to an output terminal of the power amplifier.

(23) The method of any one of (18) through (22), further comprising driving, with the low-load-modulation power amplifier, a load having a real impedance RL between 5 ohms and 100 ohms.

(24) The method of any one of (18) through (23), further comprising: operating the main amplifier in a first amplifier class; and operating the first peaking amplifier and the second peaking amplifier in a second amplifier class that is different from the first amplifier class.

(25) The method of any one of (18) through (24), further comprising: transitioning the first peaking amplifier and the second peaking amplifier to a non-amplifying state when an input signal to the low-load-modulation power amplifier drops below a threshold value; and continuing amplification, by the main amplifier, when the input signal to the low-load-modulation power amplifier drops below the threshold value.

(26) The method of any one of (18) through (25), further comprising dividing, by signal dividing circuitry, the received signal to produce the first portion, the second portion, and the third portion of the received signal.

(27) The method of (26), wherein the diving comprises dividing the received signal with a coupler that divides the received signal from the input terminal into unequal portions.

(28) The method of any one of (18) through (27), further comprising outputting a same amount of maximum power or current to within 10% from the first peaking amplifier and the second peaking amplifier when the first peaking amplifier and the second peaking amplifier are fully amplifying.

(29) The method of (28), further comprising outputting, by the main amplifier, a same amount of maximum power or current as the first peaking amplifier to within 10%.

(30) The method of (28), further comprising outputting, by the main amplifier, an amount of maximum power or current that differs by at least 20% from an amount of maximum power or current output by the first peaking amplifier.

(31) The method of any one of (18) through (30), further comprising: outputting, by the first peaking amplifier, a first amount of maximum power; and outputting, by the second peaking amplifier, a second amount of maximum power that is different from the first amount of maximum power by at least 20% when the first peaking amplifier and second peaking amplifier are fully amplifying.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "essentially" is used to mean within ±3% of and including a target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power amplifier comprising:
a main amplifier having a main output coupled to a first node;
a first peaking amplifier having a first output coupled to the first node;
a first impedance inverter connected between the first node and a second node; and
a second peaking amplifier having a second output coupled to the second node, wherein:
no impedance inverter is connected between the second output of the second peaking amplifier and the second node;
the main amplifier, first peaking amplifier, and second peaking amplifier are in three parallel circuit branches;
a maximum power output by the main amplifier differs from a maximum power output by the first peaking amplifier and from a maximum power output by the second peaking amplifier such that a peak back-off efficiency for the power amplifier is less than 9.54 dB;
a load modulation ratio $M_R$ for the power amplifier comprises a ratio of an impedance seen by the main amplifier when the first peaking amplifier and the second peaking amplifier are fully backed-off to the impedance seen by the main amplifier when the first peaking amplifier and the second peaking amplifier are fully amplifying at the maximum power output; and
the $M_R$ for the power amplifier is equal to or less than 1.8.

2. The power amplifier of claim 1, further comprising a second impedance inverter coupled to an input of the second peaking amplifier.

3. The power amplifier of claim 2, further comprising a third impedance inverter connected between the main output of the main amplifier and the first node.

4. The power amplifier of claim 3, wherein a characteristic impedance of the third impedance inverter is equivalent, to within 10%, of an impedance of a load that the power amplifier is configured to drive.

5. The power amplifier of claim 3, wherein the first impedance inverter, the second impedance inverter, and the third impedance inverter each delay a phase of a carrier wave by an amount between 85 degrees and 95 degrees.

6. The power amplifier of claim 1, wherein the first impedance inverter has a characteristic impedance that is equivalent, to within 10%, of a product of an impedance of a load that the power amplifier is configured to drive and an impedance seen at an output of the second node.

7. The power amplifier of claim 1, further comprising signal dividing circuitry arranged to receive an input signal from an input terminal of the power amplifier and output portions of the input signal to the main amplifier, the first peaking amplifier and the second peaking amplifier.

8. The power amplifier of claim 7, wherein the signal dividing circuitry comprises:
a coupler that divides a received signal from the input terminal into a first portion for the main amplifier and into a second portion for the first peaking amplifier and the second peaking amplifier, the first portion comprising one third of a power of the received signal, within 10%, and the second portion comprising two thirds of the power of the received signal, to within 10%; and
a splitter that divides the second portion into equal portions of power, within 10%, for the first peaking amplifier and the second peaking amplifier.

9. The power amplifier of claim 1, wherein the first peaking amplifier and the second peaking amplifier are configured to output a same amount of maximum power or current to within 10%.

10. The power amplifier of claim 9, wherein the main amplifier is configured to output an amount of maximum power or current that differs by at least 20% from an amount of maximum power or current output by the first peaking amplifier.

11. A method of operating a low-load-modulation power amplifier, the method comprising:
amplifying, with a main amplifier, a first portion of a received signal;
receiving, at a first node, a first signal from the main amplifier;
amplifying, with a first peaking amplifier arranged in parallel with the main amplifier, a second portion of the received signal;
receiving, at the first node, a second signal from the first peaking amplifier;
providing a first combined signal from the first node to a first impedance inverter;
providing an output signal from the first impedance inverter to a second node;
amplifying, with a second peaking amplifier arranged in parallel with the first peaking amplifier, a third portion of the received signal; and
receiving, at the second node, a third signal from an output of the second peaking amplifier with no impedance inverter connected between the output of the second peaking amplifier and the second node, wherein:
a maximum power output by the main amplifier differs from a maximum power output by the first peaking amplifier and from a maximum power output by the second peaking amplifier such that a peak back-off efficiency for the power amplifier is less than 9.54 dB;
a load modulation ratio $M_R$ for the power amplifier comprises a ratio of an impedance seen by the main amplifier when the first peaking amplifier and the second peaking amplifier are fully backed-off to the impedance seen by the main amplifier when the first peaking amplifier and the second peaking amplifier are fully amplifying at the maximum power output; and
the $M_R$ for the power amplifier is equal to or less than 1.8.

12. The method of claim 11, wherein the third portion of the received signal passes through a second impedance inverter coupled to an input of the second peaking amplifier.

13. The method of claim 12, further comprising providing the amplified first portion of the received signal to a third impedance inverter connected between an output of the main amplifier and the first node.

14. The method of claim 12, further comprising delaying, by the first impedance inverter, a phase of a carrier wave of the first combined signal by an amount between 85 degrees and 95 degrees.

15. The method of claim 11, further comprising:
operating the main amplifier in a first amplifier class; and
operating the first peaking amplifier and the second peaking amplifier in a second amplifier class that is different from the first amplifier class.

16. The method of claim 11, further comprising dividing, by signal dividing circuitry, the received signal to produce the first portion, the second portion, and the third portion of the received signal.

17. The method of claim 16, wherein the dividing comprises dividing the received signal with a coupler that divides the received signal from an input terminal into unequal portions.

18. The method of claim 11, further comprising outputting a same amount of maximum power or current to within 10% from the first peaking amplifier and the second peaking amplifier when the first peaking amplifier and the second peaking amplifier are fully amplifying.

19. The method of claim 18, further comprising outputting, by the main amplifier, an amount of maximum power or current that differs by at least 20% from an amount of maximum power or current output by the first peaking amplifier.

20. The method of claim 11, further comprising:
outputting, by the first peaking amplifier, a first amount of maximum power; and
outputting, by the second peaking amplifier, a second amount of maximum power that is different from the first amount of maximum power by at least 20% when the first peaking amplifier and second peaking amplifier are fully amplifying.

21. The method of claim 11, wherein receiving the second signal from the first peaking amplifier comprises receiving the second signal from an output of the first peaking amplifier with no impedance inverter connected between the output of the first peaking amplifier and the first node.

22. The power amplifier of claim 1, wherein no impedance inverter is connected between the first output of the first peaking amplifier and the first node.

23. The power amplifier of claim 1, wherein the $M_R$ for the power amplifier is within 10% of 1.3.

24. The power amplifier of claim 1, wherein the first peaking amplifier and the second peaking amplifier each turn on at thresholds that are within 10% of each other.

25. A power amplifier comprising:
a main amplifier having a main output coupled to a first node;
a first peaking amplifier having a first output coupled to the first node;
a first impedance inverter connected between the first node and a second node; and
a second peaking amplifier having a second output coupled to the second node, wherein:
the first peaking amplifier and the second peaking amplifier each turn on at thresholds that are within 10% of each other;
a load modulation ratio $M_R$ for the power amplifier comprises a ratio of an impedance seen by the main amplifier when the first peaking amplifier and the second peaking amplifier are fully backed-off to the impedance seen by the main amplifier when the first peaking amplifier and the second peaking amplifier are fully amplifying at a maximum power output; and the $M_R$ for the power amplifier is equal to or less than 1.8.

26. The power amplifier of claim 25, further comprising:
signal dividing circuitry arranged to receive an input signal from an input terminal of the power amplifier and output portions of the input signal to the main amplifier, the first peaking amplifier, and the second peaking amplifier, wherein the signal dividing circuitry comprises:
a coupler that divides a received signal from the input terminal into a first portion for the main amplifier and into a second portion for the first peaking amplifier and the second peaking amplifier, the first portion comprising one third of a power of the received signal, within 10%, and the second portion comprising two thirds of the power of the received signal, within 10%; and
a splitter that divides the second portion into equal portions of power, within 10%, for the first peaking amplifier and the second peaking amplifier.

27. The power amplifier of claim 25, wherein $M_R$ is to within 10% of 1.3.

28. The power amplifier of claim 25, further comprising:
a second impedance inverter coupled to an input of the second peaking amplifier; and
a third impedance inverter connected between the main output of the main amplifier and the first node.

29. The power amplifier of claim 28, wherein a characteristic impedance of the third impedance inverter is equivalent, to within 10%, of an impedance of a load that the power amplifier is configured to drive.

30. The power amplifier of claim 29, wherein the first impedance inverter, the second impedance inverter, and the third impedance inverter each delay a phase of a carrier wave by an amount between 85 degrees and 95 degrees.

31. The power amplifier of claim 25, wherein the first impedance inverter has a characteristic impedance that is equivalent, to within 10%, of a product of an impedance of a load that the power amplifier is configured to drive and an impedance seen at an output of the second node.

* * * * *